United States Patent
Eral et al.

(10) Patent No.: US 9,875,834 B2
(45) Date of Patent: Jan. 23, 2018

(54) PRINTED FLEXIBLE CIRCUIT

(71) Applicant: Sensata Technologies, Inc., Attleboro, MA (US)

(72) Inventors: Janselme M. Eral, Vista, CA (US); Richard R. Guerrero, Carlsbad, CA (US)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 15/184,626

(22) Filed: Jun. 16, 2016

(65) Prior Publication Data
US 2016/0372244 A1    Dec. 22, 2016

Related U.S. Application Data

(60) Provisional application No. 62/180,408, filed on Jun. 16, 2015.

(51) Int. Cl.
*H01F 7/02*  (2006.01)
*H05K 1/02*  (2006.01)
(Continued)

(52) U.S. Cl.
CPC ........... *H01F 7/0205* (2013.01); *H05K 1/028* (2013.01); *H05K 1/0346* (2013.01);
(Continued)

(58) Field of Classification Search
CPC .. H01F 7/0205; H05K 1/0346; H05K 1/0393; H05K 1/111; H05K 1/028;
(Continued)

(56) References Cited

U.S. PATENT DOCUMENTS 5,219,640 A      6/1993   Gazit et al.
6,084,778 A *    7/2000   Malhi ................... H05K 1/189
                                                       174/254
(Continued)

FOREIGN PATENT DOCUMENTS

DE         4325499 A1     2/1995
JP      H10290084 A     10/1998
(Continued)

OTHER PUBLICATIONS

Sep. 13, 2016—(WO) International Search Report—App PCT/US2016/037870.

*Primary Examiner* — Bernard Rojas
(74) *Attorney, Agent, or Firm* — Banner & Witcoff, Ltd.

(57) ABSTRACT

A flexible printed circuit may include a flexible body portion and a flexible head end portion, where conductors and/or elongated cut outs may be formed in a pattern. The flexible body may include a proximal end and a distal end, wherein the proximal end is configured to be connected to a stationary object and the distal end is configured to be connected to a moving object that moves in relation to the stationary object. The head end of the flexible printed circuit may be located at the distal end of the flexible body. The head end may include a plurality of elongated cut-outs, and/or a plurality of electrical connection pads suspended from the flexible body by the plurality of elongated cutouts.

17 Claims, 4 Drawing Sheets

(51) Int. Cl.
*H05K 1/03* (2006.01)
*H05K 1/11* (2006.01)

(52) U.S. Cl.
CPC .......... *H05K 1/0393* (2013.01); *H05K 1/111* (2013.01); *H05K 2201/0154* (2013.01); *H05K 2201/05* (2013.01); *H05K 2201/09063* (2013.01)

(58) Field of Classification Search
CPC ....... H05K 2201/0154; H05K 2201/05; H05K 2201/09063
See application file for complete search history.

(56) References Cited

U.S. PATENT DOCUMENTS

| | | | |
|---|---|---|---|
| 2007/0089900 A1* | 4/2007 | Mitamura | H05K 1/028 174/254 |
| 2007/0097552 A1 | 5/2007 | Lee et al. | |
| 2010/0188778 A1 | 7/2010 | Castagna | |
| 2013/0314882 A1 | 11/2013 | Cayaban et al. | |
| 2015/0305142 A1* | 10/2015 | Matsuda | H05K 1/024 333/238 |

FOREIGN PATENT DOCUMENTS

| | | | |
|---|---|---|---|
| JP | 2007258593 A | 10/2007 | |
| WO | 2014045862 A1 | 3/2014 | |

* cited by examiner

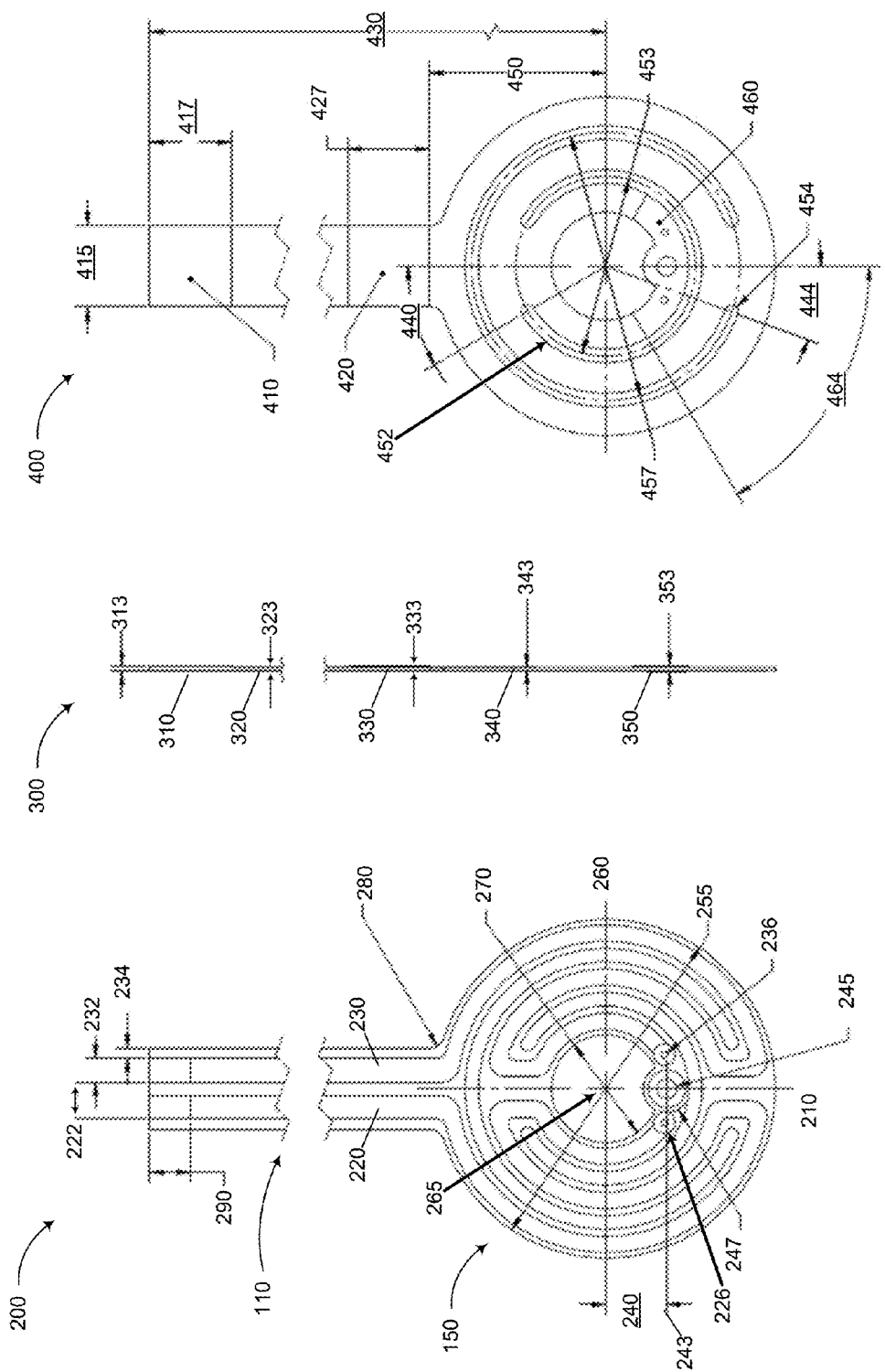

PRINTED FLEXIBLE CIRCUIT

This application claims the benefit of, and priority to, U.S. Provisional Patent Application Ser. No. 62/180,408 filed Jun. 16, 2015. The contents of the above-identified application are expressly incorporated herein by reference in its entirety for any and all non-limiting purposes.

BACKGROUND OF THE INVENTION

Flexible circuits (e.g., "flex circuits") may include one or more electrical components and/or electrical conductors mounted or otherwise formed on a flexible plastic substrate. In some cases, flexible printed circuits may be formed by a screen printing process. In doing so, the flexible circuit may be configured to conform to a particular shape or to flex or otherwise deform during use. In some cases, the flexible circuit may comprise a passive wiring structure that may be used to provide an electrical connection between a stationary device and a moving device. For example, a linear actuator may include a stationary component and a moving component configured to move in a linear relationship to the stationary component.

Once such linear actuator may include a voice coil actuator that may be configured for a defined motion profile. For example, the linear actuator may be configured for a short stroke (e.g., less than about 2 inches, less than about 3 inches, etc.) application, such as a closed loop servo application. Advantages to using such a linear actuator may include a compact size, such that the linear actuator may fit in a small space, very low electrical and/or mechanical time constant to improve responsiveness and/or a low moving mass that may allow for high accelerations of light payloads. Linear actuators may be used in applications requiring precise force control due to a close relationship between a linear force associated with the moving linear actuator versus the current characteristics of the device.

Some applications may be configured to control the movement of the linear actuator based on the noted relationship between current and a resulting force. In some cases, the force may be proportional to an acceleration of the moving portion of the linear actuator. In such current control applications, to other system forces such as friction, may be minimized to produce a desired accuracy. In some cases, however, a flexible circuit providing one or more electrical signals to or from the moving component may experience a torsion causing at least a portion of the flexible circuit to deform. In such cases, a portion of the deformed flexible circuit, or any other moving component, may contact a portion of the stationary component as it moves in relation to the moving component. As a result of the contact, a frictional force may be created that, in turn, may reduce the accuracy of the linear actuator. As such, a need for a flexible printed circuit capable of elimination of at least a portion of a torsional spring effect experienced in current flex circuit designs has been recognized.

SUMMARY OF THE INVENTION

Aspects of the present disclosure address one or more of the issues mentioned above by disclosing systems, devices, and methods. The following presents a simplified summary of the disclosure in order to provide a basic understanding of some aspects. It is not intended to identify key or critical elements of the invention or to delineate the scope of the invention. The following summary merely presents some concepts of the disclosure in a simplified form as a prelude to the more detailed description provided below.

In one embodiment in accordance with various aspects of the invention, A flexible printed circuit may include a flexible body portion and a flexible head end portion, where conductors and/or elongated cut outs may be formed in a pattern. The flexible body may include a proximal end and a distal end, wherein the proximal end is configured to be connected to a stationary object and the distal end is configured to be connected to a moving object that moves in relation to the stationary object. The head end of the flexible printed circuit may be located at the distal end of the flexible body. The head end may include a plurality of elongated cut-outs, and/or a plurality of electrical connection pads suspended from the flexible body by the plurality of elongated cutouts.

BRIEF DESCRIPTION OF THE DRAWINGS

The present disclosure is illustrated by way of example and not limited in the accompanying figures in which like reference numerals indicate similar elements and in which:

FIG. 2 shows a representation of a front-side view of an illustrative flexible printed circuit according to aspects of the present disclosure;

FIG. 3 shows a representation of a side view of an illustrative flexible printed circuit according to aspects of the present disclosure;

FIG. 4 shows a representation of a back-side view of an illustrative flexible printed circuit according to aspects of the present disclosure;

DETAILED DESCRIPTION

Figure 1:
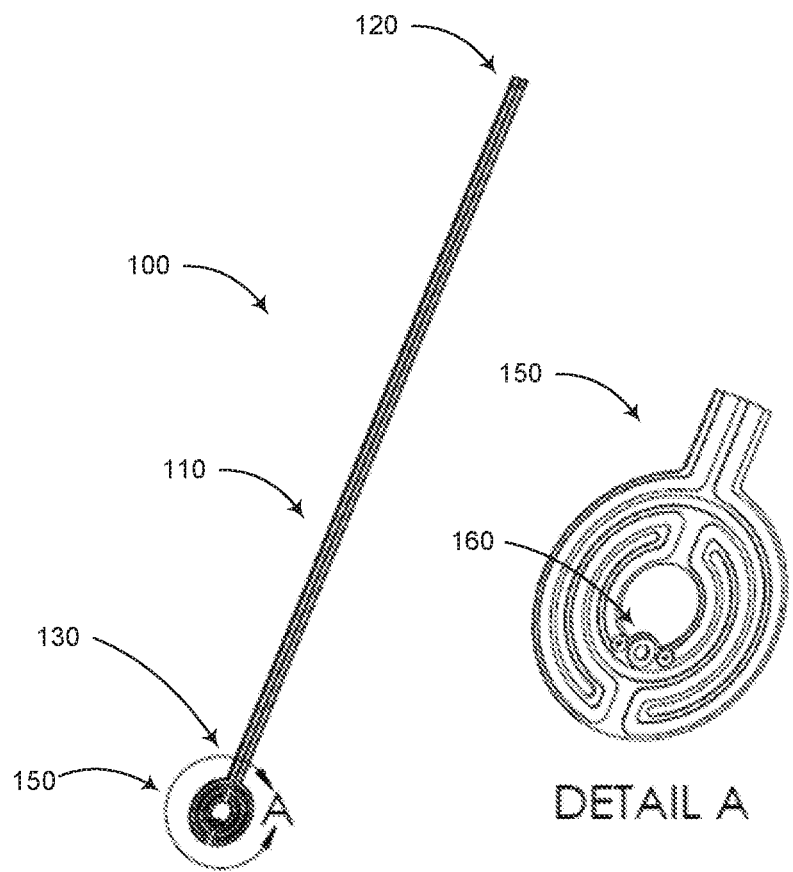
FIG. 1 shows an illustrative flexible printed circuit according to aspects of the present disclosure.

FIG. 1 shows an illustrative flexible printed circuit 100 according to aspects of the present disclosure. The flexible printed circuit 100 may be configured to provide power and/or an electrical signal from a stationary electrical circuit to an electrical circuit moving in relation to the stationary electrical circuit. In an illustrative example, the printed electrical circuit may be configured for use in a linear actuator, such that the flexible electrical circuit provides an electrical connection to the moving portion of the linear actuator. The flexible printed circuit 100 may include a flexible body 110 having a proximal end 120 and a distal end 130. At the distal end 130 of the flexible body 110, the flexible printed circuit 100 may include a head end 150 may be include a connection portion that may include one or more electrical connection points and/or one or more physical connection points. The proximal end 120 may be configured to be physically and/or electrically connected to a stationary portion of a device, such as at a physical connection point and/or an electrical connection point located in an interior portion of the noted linear actuator. For example, an electrical contact formed on the proximal end 120 of the flexible body may be physically and/or electrically connected to an electrical contact formed on the stationary portion of an electrical device. The electrical and/or physical connection may be formed using a nearly permanent connection (e.g., a solder connection, an adhesive, etc.), or a removable connection using one or more fasteners (e.g., a screw, a bolt, etc.) or connectors (e.g., a wire terminal connector, a crimp connector, a clamping connector, a screw-type connector, a pin-type connector, a compression fitting, a plug-type fitting, etc.).

At the distal end 130 of the flexible body 110, the head end 150 may be configured to be physically and electrically connected to the moving portion of an electrical device, such as a coil portion of a linear actuator. The linear actuator (e.g. a voice coil actuator) may allow linear movements over a limited range of motion, where the range of motion may be less than the length of the flexible body of the flexible printed circuit. The linear actuator may be a direct drive device that may be based on a permanent magnetic field generated on a stationary portion of the linear actuator and a current-carrying coil winding, which may be included on the moving portion of the linear actuator. A force may be produced that may be directly proportional to the current applied to the coil windings. In a closed-loop system, such as a servo system, a position sensor may be included on the moving portion of the linear actuator. The position sensor may provide a feedback signal to a motion controller to enable high speed movements with high accuracy. In some cases, a linear actuator may comprise a tubular coil of wire placed within a radially oriented magnetic field. The magnetic field may be generated by one or more tubular permanent magnets having a radial magnetization. The permanent magnets may be mounted on an interior of a hollow cylinder having an inner iron core aligned along a center line of the hollow cylinder. The hollow cylinder and the core may form a shell of the actuator. The cylindrical coil may be positioned to move freely along an axis of motion aligned with the center line of the cylindrical housing. The movement of the linear actuator may be limited in stroke length, by the force of friction, and/or a load on the moving portion of the actuator (e.g., an actuator arm.). In some cases, the flexible printed circuit may include two or more conductors for providing one or more electrical connections to the moving portion of the actuator, such as to provide power to the coil. In other cases, two or more conductors may be used to provide one or more other electrical signals, such as a feedback signal from a position sensor associated with the actuator arm.

FIG. 2 shows a representation of a front-side view 200 of an illustrative flexible printed circuit according to aspects of the present disclosure. In the front-side view 200 of the flexible printed circuit 100. The flexible body 110 may include two or more conductors 220, 230 that may be disposed symmetrically on either side of a line of symmetry 210. In some cases, the flexible body may include one or more lines of symmetry. The flexible printed circuit 100 may be installed such that the line of symmetry 210 aligns with an axis of movement of the moving body to which the flexible printed circuit 100 is attached. The conductors may each have a same width 232 (e.g., about 1.75 mm) and may be spaced equally from at least one line of symmetry, such as the line of symmetry 210 and/or from an edge of the flexible body 110. For example, a first conductor 230 may be printed using a conductive material (e.g., copper, a conductive ink, silver, gold, aluminum, etc.) and may be located a distance 234 (e.g., about 0.75 mm) from the edge of the flexible body 110. In some cases, an edge of the conductor 230 nearest to the line of symmetry 210 may be spaced a distance 222 (e.g., about 2.75 mm) from an edge of the second conductor 220 nearest the second edge of the flexible body 110. The distal end of the flexible body 110 may include a reinforced portion along a length 290 of the distal end of the flexible body 110.

In some cases, the electrical conductors 220, 230 may follow symmetrical paths around elongated cutouts in the flexible head 150 of the flexible printed circuit 100. The electrical conductors may terminate in an electrical connection pad 226, 236 having a diameter of about 0.5 mm and for connecting (e.g., via a solder joint) to an electrical circuit (e.g., a coil) on a moving portion of an electrical device. The flexible head may further include a physical connection point 245 (e.g., a reinforced through hole having a diameter of about 1.45 mm) for physically connecting the flexible head 150 of the flexible printed circuit 100 to the moving portion of the electrical device, such as by using a fastener (e.g., a screw, a bolt, etc.). In some cases, the electrical connection 226, 236 may share a center line 243. In some cases, the physical connection point 245 may share the same center line. In some cases, a center of the physical connection point 245 may be located at a point on the line of symmetry 210. In some cases, the first electrical conductor 230 may be electrically isolated from the second electrical conductor and/or the physical connection point 245 by an insulator 247 that may have a radius (e.g., about 1.75 mm). In some cases, the flexible head 150 may have a defined shape (e.g., a circle having a radius of about 25 mm) include a central opening 270 having a radius (e.g., about 8 mm). The centers of the electrical connection point 245 and the central opening 270 of the flexible head 150 may be located along the line of symmetry 210 and/or may be disposed a distance 240 (e.g., about 4.5 mm) apart. In some cases, the connection between the flexible body 110 and the flexible head 150 may have a defined edge. In other cases, the connection between the flexible body 110 and the flexible head 150 may be blended, such as using a semi-circular curve between the two portions of the flexible printed circuit 100, such that may have a radius of about 1 mm.

In some cases, the electrical connection points 226, 236 and/or the physical connection point 245 may comprise a surface mount pad that may have a plating (e.g., solder plating) and may have a defined flatness (e.g., flat to a maximum of about 0.025 mm) above a surface (e.g., a top surface, a bottom surface) of the flexible printed circuit 100. In some cases, the electrical conductors 220, 230 may comprise a conductive pattern (e.g., a copper overlay, a conductive ink, etc.) on the surface of a substrate (e.g., a plastic) of the flexible printed circuit. In some cases, the flexible printed circuit 100 may be formed of a flexible plastic such as a polyimide (e.g., Kapton), or other such flexible substrate. In some cases, all exposed conductive features (e.g., the conductors 220, a bare copper surface, etc.) may be coated with a coverlay substance, such as an electrical insulator. For conductive portions of the flexible printed circuit not covered with a coverlay, the surface may be plated, such as with lead-free immersion silver or other such substance having similar properties. In some cases, the conductive pattern, or other features of the flexible printed circuit may be formed using a silk screening process, such as by using a white, permanent, organic, non-conductive ink.

FIG. 3 shows a representation of a side view 300 of an illustrative flexible printed circuit according to aspects of the present disclosure. As can be seen the printed flexible printed circuit 100 may include one or more flexible portions 320, 340 and one or more stiffened portions 310, 330, 350, and the like. In some cases, the flexible portions may be formed of a flexible plastic (e.g., a polyimide (e.g., Kapton) and may have a defined thickness 323, 343 (e.g., about 0.21 mm, about 0.25 mm, and the like). In some cases, the stiffened portions 310, 330, 350 may have a thickness greater than the flexible portions 320, 340, such as a thickness 313, 333, 353. In some cases, the stiffened portions 310, 330, 350 may be formed of the same flexible plastic substrate and may include additional material (e.g., a double sided 1 oz Cu RA with a polyimide stiffener, and may have a low outgassing adhesive, such as an acrylic adhesive. as can be seen, the stiffened portions may correspond to a portion of the flexible printed circuit 100 that may require additional support, such as at the connection point at the proximal end of the flexible body 110, at a border between the flexible body 110 and the flexible head 150, and/or at the location of the electrical connection pads 226, 236 and/or the physical connection point 245

FIG. 4 shows a representation of a back-side view 400 of an illustrative flexible printed circuit according to aspects of the present disclosure. The back-side view 400 may show a number of features such as a stiffened portion of the flexible substrate having a length 417 (e.g., about 6 mm) to provide additional physical strength to the flexible body 110. The second stiffened portion 420 of the flexible body 110 may be located at or near the connection between the flexible body 110 and the flexible head 150. Here the second stiffened portion 420 of the flexible substrate may have a length of about 6 mm. The central opening 270 of the head end 150 may be located at a defined distance 430 (e.g., about 285 mm) from the proximal end of the flexible body 110 and/or at a defined distance 450 (e.g., about 13 mm) from the border between the flexible body 110 and the flexible head end 150.

As discussed above, the flexible head end may include one or more elongated openings 452, 454 to provide further flexibility and torsion resistance to a twisting or along the length of the flexible printed circuit 100. In some cases, an applied torsion about the line of symmetry may cause the flexible printed circuit 100 to twist and thereby may contact the stationary portion of the linear actuator and/or the moving portion of the linear actuator. The first elongated opening 452 and/or the second elongated opening 454 may comprise semi-circular openings formed in the flexible substrate. The first elongated opening 452 and the second elongated opening 454 may share a center point 265 with the central opening 270 and/or the flexible head end 150, where the semi-circular elongated openings start and/or end at an angle 440 (e.g., about 30 degrees) referred from the line of symmetry 210. In another example, the second elongated opening 454 may comprise a semicircular opening towards the outer edge of the flexible head 150, where the semi-circular elongated openings start and/or end at an angle 444 (e.g., about 20 degrees). in some cases, the stiffened portion 353 of the flexible head 150 including the electrical connection points may be formed in a semi-circular pattern about the central opening 270, where the stiffened portion 353 extends a number of degrees 464 (e.g., about 60 degrees) from the line of symmetry 210. In some cases, the second elongated opening 452 may be formed having a diameter 457 (about 19.75 mm) and/or the first elongated opening 452 may be formed having a diameter 453 (e.g., about 13.25 mm). In some cases, the elongated openings may be formed using a drill bit having a radius of 0.5 mm, so that the width of the elongated openings 450, 452 may be about 1 mm.

Figure 5:
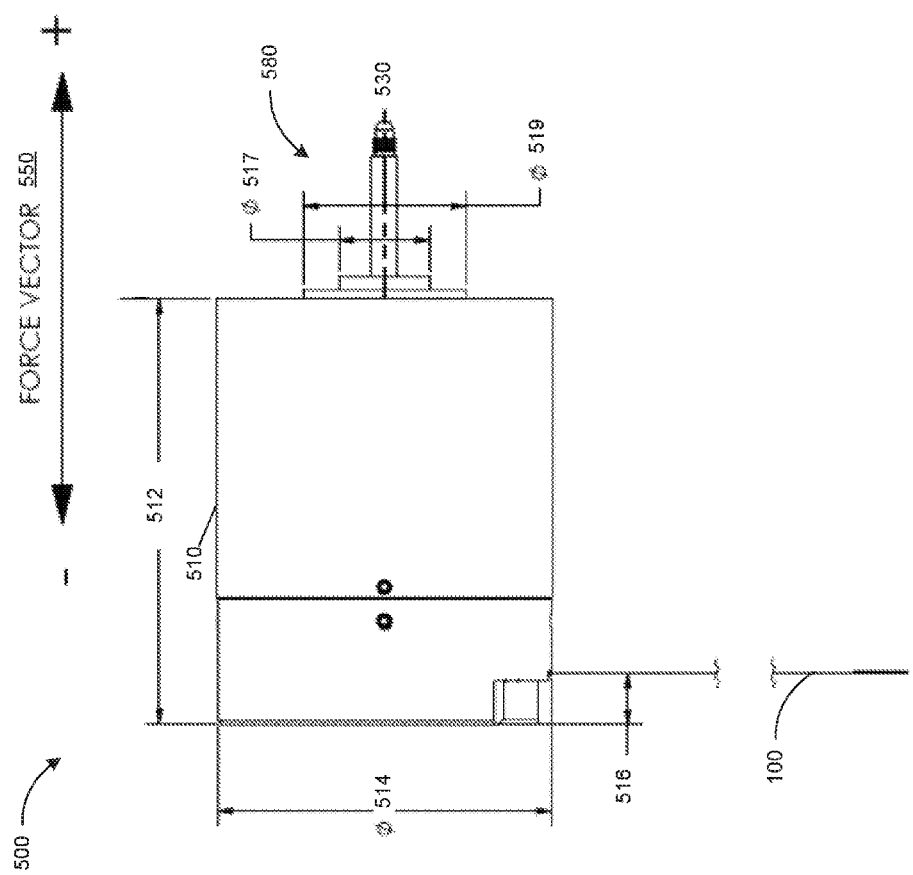
FIG. 5 shows a representation of a side view of an illustrative device incorporating the printed flexible circuit according to aspects of the present disclosure.

In an illustrative example, the symmetric flexible printed circuit may be used to eliminate a torque applied to it while the flexible printed circuit moves in the direction of travel of the motion device. For example, FIG. 5 shows a representation of a side view of an illustrative motion device 500 (e.g., a linear actuator, a voice coil actuator, etc.) incorporating the printed flexible circuit according to aspects of the present disclosure. When using a line of symmetry corresponding to the symmetrical nature of the flexible printed circuit 100, the torques, as applied to each symmetrical portion of the flexible printed circuit may cancel each other. The flexible printed circuit described herein may be directed generally to the improved integrated design without the torque side effect. The torque side effect may cause the linear actuator to encounter increased friction, and/or distortions in the shaft position may cause distortion the shaft position, etc. The symmetric flexible printed circuit may eliminate the torque applied to it while it moves in the direction of travel of the motion device. FIGS. 1, 2, and 4 can identify, for example, two symmetrical tracks. However, the number of tracks and/or the lines of symmetries are not limited to two. An axis of symmetry (e.g., the line of symmetry 210) may coincide with the axis of motion (e.g., is orthonormal to the axis of motion). The torques, as applied to each track, may cancel each other. The discussed illustrative flexible printed circuit 110 may present include the above-mentioned features and/or other improvements such as cutoffs, multi tracks, additional turns, etc., may be utilized.

In the illustrative example of FIG. 5, the illustrative motion device 500 may have a housing 510, such as a cylindrical housing having a length 512 (e.g., about 48 mm) and having a diameter 514 (e.g., about 37.8 mm). In some cases, an opening or other such portal may be included in the housing 510 to allow at least a portion of the flexible printed circuit 100 to extend outward from the interior portion of the illustrative motion device 500. For example, the portion of the flexible printed circuit 100 may extend outward through the opening at a distance 516 (e.g., about 6 mm) from the rear portion of the illustrative motion device 510. The illustrative motion device 500 may include a face portion 580 through which a shaft 530 may movably extend outward from a face portion of the motion device 500, where a force vector 550 may extend linearly along the axis of the shaft 530. In the illustrative example, the face of the motion device may be located at a circular portion of the cylindrical housing 510. The face portion may include one or more extended portions extending past an end of the housing 510. Such extended portions may be used to provide support for the housing 510, the shaft 530 or both when installed in an end-user application. In the illustrative case, the extended portions have a first portion having a first diameter 519 (e.g., about 18.5 mm) and a second portion extending beyond the first portion and having a second diameter (e.g., about 10.35 mm).

Figure 6:
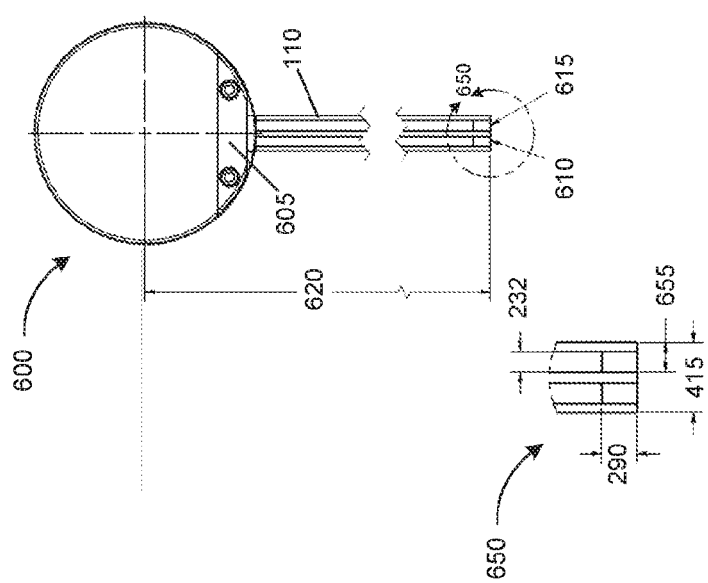
FIG. 6 shows a representation of a back view of the illustrative device incorporating the printed flexible circuit according to aspects of the present disclosure.

In an illustrative case, a linear actuator, such as a fully housed voice coil actuator (VCA), as shown, or a semi-housed VCA, may incorporate one or more self-aligning bushings and the shaft 530 to align a shaft at a desired position in relation to the housing. A full housing may be used to fully enclose a coil assembly to ensure that the coil assembly remains concentrically aligned with a field assembly. An internal flex circuit (e.g., the flexible circuit 100) may be used to protect external moving wires and/or may also limit the axial travel at the start of the stroke, the end of the stroke or both. When fully housed, as illustrated in FIG. 5, the linear actuator may be mounted on one side and does not require a customer supplied alignment system, to allow for easier integration into applications. Advantages of such fully housed linear actuators or voice coil actuators include direct-drive, zero backlash and cog free operation for accurate motion, as well as high acceleration and use of single phase power. FIG. 6 shows a representation of a back view 600 of the illustrative device 500 incorporating the printed flexible circuit 100 according to aspects of the present disclosure As can be seen, the opening at the rear of the housing 510 may include a cover 605 that may be removably fastened to the housing 510. The flexible body 110 of the flexible printed circuit 100 may extend outward from the opening and may be secured in place by the cover 605 portion to minimize (or remove) any effects of movement of the flexible body 100 outside of the housing 510 from being transferred to the portions of the flexible printed circuit 100 within an interior space within the housing 510. The flexible body 100 may extend a distance 620 (e.g., about 285 mm) from a point (e.g., a center line) of the back of the housing 510. The proximal end 120 of the flexible printed circuit 100 is shown in greater detail in the magnified view 650. The proximal end 120 may include two or more connection points 610, 615 to allow for an electrical connection to be made to the motion device 500. The connection points 610, 615 may have a width that may be the same as or different than the width 232 of the conductors 220, 230. As shown, the connection points 610, 615 have width that is the same as the width 232 of the conductors 220, 230. In some cases, the connection points 610, 620 may be positioned within a defined distance 655 (e.g., about 2.5 mm) from an edge of the flexible printed circuit 100.

Figure 7:
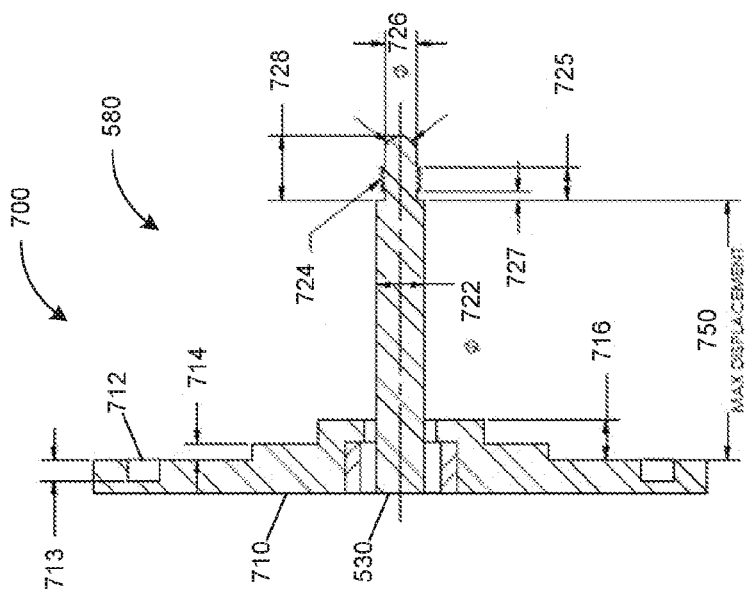
FIG. 7 shows a representation of a cross sectional view of a portion of the illustrative device incorporating the printed flexible circuit according to aspects of the present disclosure.

FIG. 7 shows a representation of a cross sectional view 700 of a face portion 580 of the illustrative device incorporating the printed flexible circuit 100 according to aspects of the present disclosure. In an illustrative example of a motion device incorporating the printed flexible circuit 100, the cross sectional view 700 of the face portion 580 includes a cross section of the face portion 710 of the motion device 100 and a cross section of the shaft 530. As can be seen, the face portion 710 includes one or more openings 712 for receiving a fastener (e.g., a screw, a bolt, etc.) for use in fastening the face portion 710 to the housing 510. In some cases, the opening may include a first depth 713 of a first diameter for receiving a head portion of the fastener, and a second diameter (not shown) for receiving at least a second portion of the fastener. As discussed above, the face portion 710 may include a first elevated portion that may be elevated a distance 714 (e.g., about 1 mm) from the surface of the face portion 710 and a second elevated portion that may be elevated a second distance 716 (e.g., about 2.5 mm) from the surface of the face portion 710.

In some cases, the shaft 530 may have a first diameter 722 (e.g., about 3 mm) comprising a majority of the shaft 530 and a second portion having a second diameter 726 (e.g., about 2 mm). The second portion of the shaft 530 may be configured to be attached to a portion of a device (e.g., a machine) in which the motion device 500 may be installed. The second portion of the shaft 530 may have an overall length 728 (e.g., 0.4 mm) and may include a threaded portion 724 to facilitate the connection to a movable portion of the machine to which the motion device is attached. In the illustrative example, the threaded portion 724 may include a space 727 (e.g., about 0.5 mm) from the larger diameter portion of the shaft 530 and may have an overall length 725 (e.g., about 2 mm). The use of the flexible printed circuit 100 may allow a minimized torque to be applied to the shaft 530, or may eliminate this torque. As such, the threaded portion 524 of the shaft 530 may be able to travel a maximum displacement 750 (e.g., about 16.2 mm) and may experience a minimized frictional force.

In an illustrative example, the motion device 500 may be a "low-hysteresis linear actuator", where use of the flexible printed circuit 100 may allow for minimizing parasitic torque induced with linear motion. This torque, when using the flexible printed circuit, may be low enough, such that the torque may be effectively zero. In some cases, a linear spring constant of 0.5 N/m. In some cases, the low-hysteresis linear actuator may have a specified set of winding constants and/or a set of linear actuator parameters based, at least in part, on the use of the flexible printed circuit 100. In the illustrative example, the winding constants may include one or more of a DC resistance (e.g., from about 1 Ohm to about 5 Ohms, from about 6 Ohms to about 10 Ohms, etc.), a voltage at peak force (e.g., from about 4V to about 15V, etc.), a current at peak force (e.g., from about 1 A to about 5 A, from about 5 A to about 10 A, etc.), a force sensitivity (e.g., from about 1 N/A to about 10 N/A, etc.), a back EMF constant (e.g., from about 1 V/V/(m/s) to about 10 V/(m/s), etc.), an inductance that may be measured at a specified frequency (e.g., about 100 Hz, about 500 Hz, about 1000 Hz, about 10 kHz, etc.), and the like. Further, in the illustrative example, the linear actuator parameters may include a peak force (e.g., about 5 N, about 10 N, about 15 N, about 20 N, etc.), a continuous stall force (e.g., from about 1 N to about 10 N, etc.), an actuator constant (e.g., about 1-5 N/sqrt(W)), an electrical time constant, a mechanical time constant (e.g., about 1 ms, about 2 ms, about 3 ms, about 4 ms, etc.), a theoretical acceleration (e.g., about 300 m/s, about 500 m/s, about 600 m/s, about 700 m/s, etc.), a maximum theoretical frequency (e.g., about 50 Hz, about 70 Hz, about 90 Hz, etc.) at full stroke and/or a maximum theoretical frequency at sinusoidal or triangular motion (e.g., about 50 Hz, about 70 Hz, about 90 Hz, etc.), a power ($I^2R$) at peak force (e.g., about 15 W, about 20 W, about 25 W, about 30 W), an operational stroke parameter (e.g., about 5 mm, about 6 mm, about 7 mm, about 8 mm, etc.), a total stroke parameter (e.g., about 5 mm, about 6 mm, about 7 mm, about 8 mm, etc.), a friction force (e.g., less than about 0.02 N, less than about 0.005 N, less than about 0.01N, etc.), a thermal resistance of the coil, a maximum allowable coil winding temperature, and the like. In some cases, the weight of the moving coil assembly (e.g., from about 10 g to about 40 g, etc.), may be a fraction of the total weight (e.g., about 250 g, about 300 g, etc.) of the linear actuator.

Aspects of the invention have been described in terms of illustrative embodiments thereof. The measurements included in the specification are for illustrative purposes and may include a tolerance as would be understood by one skilled in the art. The features of the embodiments described below contemplate other embodiments comprising one or more, or a combination thereof, of the aspects described throughout. Numerous other embodiments, modifications and variations within the scope and spirit of the appended claims will occur to persons of ordinary skill in the art from a review of this disclosure. For example, one of ordinary skill in the art will appreciate that the steps illustrated in the illustrative figures may be performed in other than the recited order, and that one or more steps illustrated may be optional in accordance with aspects of the disclosure.

What is claimed is:
1. A flexible printed circuit comprising:
  a flexible body having a proximal end and a distal end, wherein the proximal end is configured to be connected to a stationary object and the distal end is configured to be connected to a moving object that moves in relation to the stationary object;

a head end of the flexible printed circuit at the distal end of the flexible body, the head end comprising:
  a plurality of elongated cut-outs;
  a plurality of electrical connection pads; and
  a center opening of the flexible head-end, wherein the center opening is at least nearly co-centric with the flexible head-end and the plurality of elongated cutouts; and
  wherein the plurality of electrical connection pads are located between an interior cutout of the plurality of elongated cutouts and the center opening of the head end.

2. The flexible printed circuit of claim 1 comprising:
at least one line of symmetry associated with the flexible body and the head end of the flexible body, the line of symmetry defines lateral symmetry from the proximal end of the body to a distal end of the head end of the flexible printed circuit.

3. The flexible printed circuit of claim 2, wherein the line of symmetry is orthonormal to an axis of motion of the moving object in relation to the stationary object.

4. The flexible printed circuit of claim 2, comprising a first electrical conduction path at a first side of the line of symmetry and a second electrical conduction path at a second side of the line of symmetry.

5. The flexible printed circuit of claim 1, wherein a torsion induced at the head end of the flexible printed circuit by a movement of the moving object is compensated before being transferred to the flexible body.

6. The flexible printed circuit of claim 1, wherein the opening is configured to receive a portion of the moving object.

7. The flexible printed circuit of claim 6, wherein the opening near the center of the head end is nearly circular.

8. The flexible printed circuit of claim 6, wherein a center of the opening lies on a line of symmetry along the head end.

9. The flexible printed circuit of claim 1, comprising a flexible plastic substrate.

10. The flexible printed circuit of claim 9, wherein the flexible plastic substrate comprises a polyimide.

11. The flexible printed circuit of claim 9, further comprising a plurality of reinforced portions of the flexible circuit, the reinforced portions comprising additional substrate material of the flex body or the flex head.

12. The flexible printed circuit of claim 11, wherein the plurality of reinforced portions of the flex body or the flex head comprise a polyimide stiffener.

13. The flexible printed circuit of claim 1, comprising a physical connection point and the plurality of electrical connection pads suspended near the center of the flex head.

14. The flexible printed circuit of claim 13, wherein the physical connection point and the plurality of electrical connection pads are in a spaced relationship about a line of symmetry defining lateral symmetry of the flexible printed circuit.

15. A flexible printed circuit, comprising:
  a flexible head end comprising a plurality of electrical conductors symmetrically arranged about a line of symmetry;
  a plurality of electrical connection pads, each electrical connection pad being electrically coupled to a corresponding one of the plurality of electrical conductors; and
  a plurality of elongated cut-outs in the flexible head end, the elongated cut-outs symmetrically arranged about the line of symmetry, wherein a torsion applied near the center of the flexible head end is minimized before being transferred along a flexible body of the flexible printed circuit extending from the flexible head-end; and
  a center opening of the flexible head-end, wherein the center opening is at least nearly co-centric with the flexible head-end and the plurality of elongated cutouts.

16. The flexible printed circuit of claim 15, comprising at least one physical connection point, wherein the center of the at least one physical connection point is located on or near the line of symmetry.

17. The flexible printed circuit of claim 15, further comprising a flexible body extending along the line of symmetry from the head end, wherein the plurality of electrical conductors extend along the line of symmetry to transfer electrical energy from a stationary electrical connection to an object moving linearly along the line of symmetry.

* * * * *